US010354705B2

(12) United States Patent
Ohgami

(10) Patent No.: US 10,354,705 B2
(45) Date of Patent: Jul. 16, 2019

(54) APPARATUSES AND METHODS FOR CONTROLLING WORD LINES AND SENSE AMPLIFIERS

(71) Applicant: Micron Technology, Inc., Boise, ID (US)

(72) Inventor: Takeshi Ohgami, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/642,145

(22) Filed: Jul. 5, 2017

(65) Prior Publication Data

US 2019/0013055 A1   Jan. 10, 2019

(51) Int. Cl.
| G11C 8/08 | (2006.01) |
| G11C 7/08 | (2006.01) |
| G11C 8/10 | (2006.01) |
| G11C 8/14 | (2006.01) |

(52) U.S. Cl.
CPC .................. *G11C 8/08* (2013.01); *G11C 7/08* (2013.01); *G11C 8/10* (2013.01); *G11C 8/14* (2013.01)

(58) Field of Classification Search
CPC ................ G11C 8/08; G11C 7/08; G11C 8/10
See application file for complete search history.

(56) References Cited

U.S. PATENT DOCUMENTS

| 6,535,435 | B2 | 3/2003 | Tanaka et al. |
| 6,747,509 | B2 | 6/2004 | Horiguchi |
| 7,842,976 | B2 | 11/2010 | Fuji et al. |
| 9,418,711 | B2 | 8/2016 | Ohgami |
| 2011/0026290 | A1 | 2/2011 | Noda et al. |
| 2011/0158023 | A1* | 6/2011 | Yun .......................... G11C 7/08 365/207 |
| 2015/0098260 | A1 | 4/2015 | Ohgami |

FOREIGN PATENT DOCUMENTS

JP    2012-243341    12/2012

* cited by examiner

*Primary Examiner* — Mohammed A Bashar
(74) *Attorney, Agent, or Firm* — Dorsey & Whitney LLP

(57) ABSTRACT

Apparatuses and methods for controlling word lines and sense amplifiers in a semiconductor device are described. An example apparatus includes: a plurality of sense amplifier control circuits coupled to a plurality of corresponding sense amplifiers, wherein each sense amplifier control circuit of the plurality of sense amplifier control circuits provides one or more control signals to a corresponding sense amplifier of a plurality of sense amplifiers; and a driver that provides a selection signal to a plurality of word drivers responsive, at least in part, to a first control signal that is responsive to the one or more control signals from the plurality of sense amplifier control circuits.

20 Claims, 15 Drawing Sheets

FIG. 3

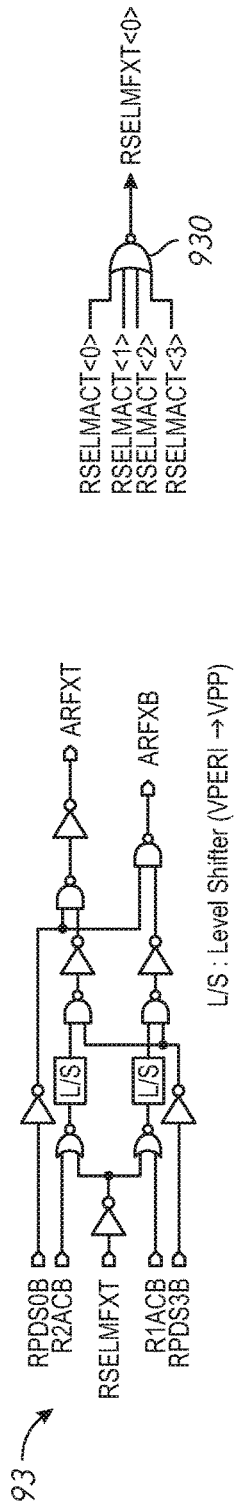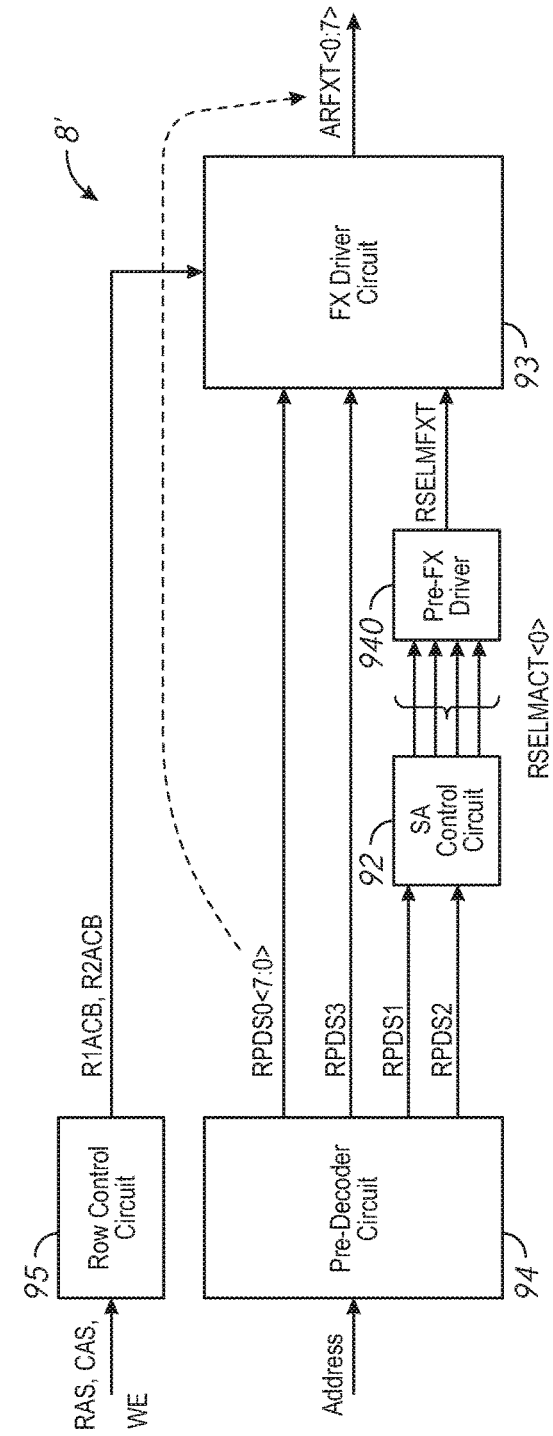

APPARATUSES AND METHODS FOR CONTROLLING WORD LINES AND SENSE AMPLIFIERS

BACKGROUND

In semiconductor devices of recent years, high capacity of memory device has been strongly demanded as well as reduction in chip size. However, the increase of the capacity of memory devices, such as a larger number of memory banks tends to result in a larger memory chip size because a plurality of access signal lines is aligned with intervals in a chip layout in order to avoid undesired noise effects from adjacent signal lines. Consequently, the increased number of signal lines with more intervals results in a larger space in the chip layout of multi-bank structure in a memory device serving as a main memory (e.g., dynamic random access memory (DRAM)).

Some techniques to access a plurality of banks have been disclosed. For example, U.S. Pat. No. 9,418,711 teaches a memory device including a plurality of memory mats classified into groups selected by bits of a row address, a main word driver for selecting a main word line based on bits of the row address, an FX driver for selecting a word driver selecting line (FX) based on bits regardless of the bits of the row address, and a plurality of sub-word drivers selected by the main word line and the word driver selecting line to drive the corresponding sub-word line. FIG. 1 is a circuit diagram of a sub-word driver circuit in a memory device. For example, the sub-word driver circuit in FIG. 1 includes four sub-word drivers. Each sub-word driver activates a sub-word line (AASWLT) responsive to three signal lines including a main word line (ARMWLB) and a pair of word driver selecting lines (ARFXT/ARFXB). FIG. 2 is a schematic diagram of main word lines (ARMWLB), word driver selecting lines (ARFXT/ARFXB), and sub-word lines (AASWLT) in a memory mat (MAT) in the memory device. In FIG. 2, eight sub-word lines (AASWLT) are coupled to one main word line (ARMWLB). Of these eight sub-word lines (AASWLT), any one sub-word line (AASWLT) is activated with eight pairs of word driver selecting lines (ARFXT/ARFXB). A pair of word driver selecting lines (ARFXT/ARFXB) in the sub-word driver SWD is common for two memory mats (MAT). Therefore, an increase in a number of FX drivers causes an increase of an area of the X decoder. If a number of circuit components in each FX driver increase, the size of the area of the X decoder also increases.

BRIEF DESCRIPTION OF THE DRAWINGS

FIG. 3 is a layout diagram of a memory bank in accordance with an embodiment of the present disclosure.

FIG. 9A is a circuit diagram of an FX driver circuit in accordance with an embodiment of the present disclosure.

FIG. 9B is a circuit diagram of a pre-FX driver circuit in accordance with an embodiment of the present disclosure.

FIG. 9C is a block diagram of a mat selection logic circuit in an X decoder circuit in accordance with an embodiment of the present disclosure.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 3:
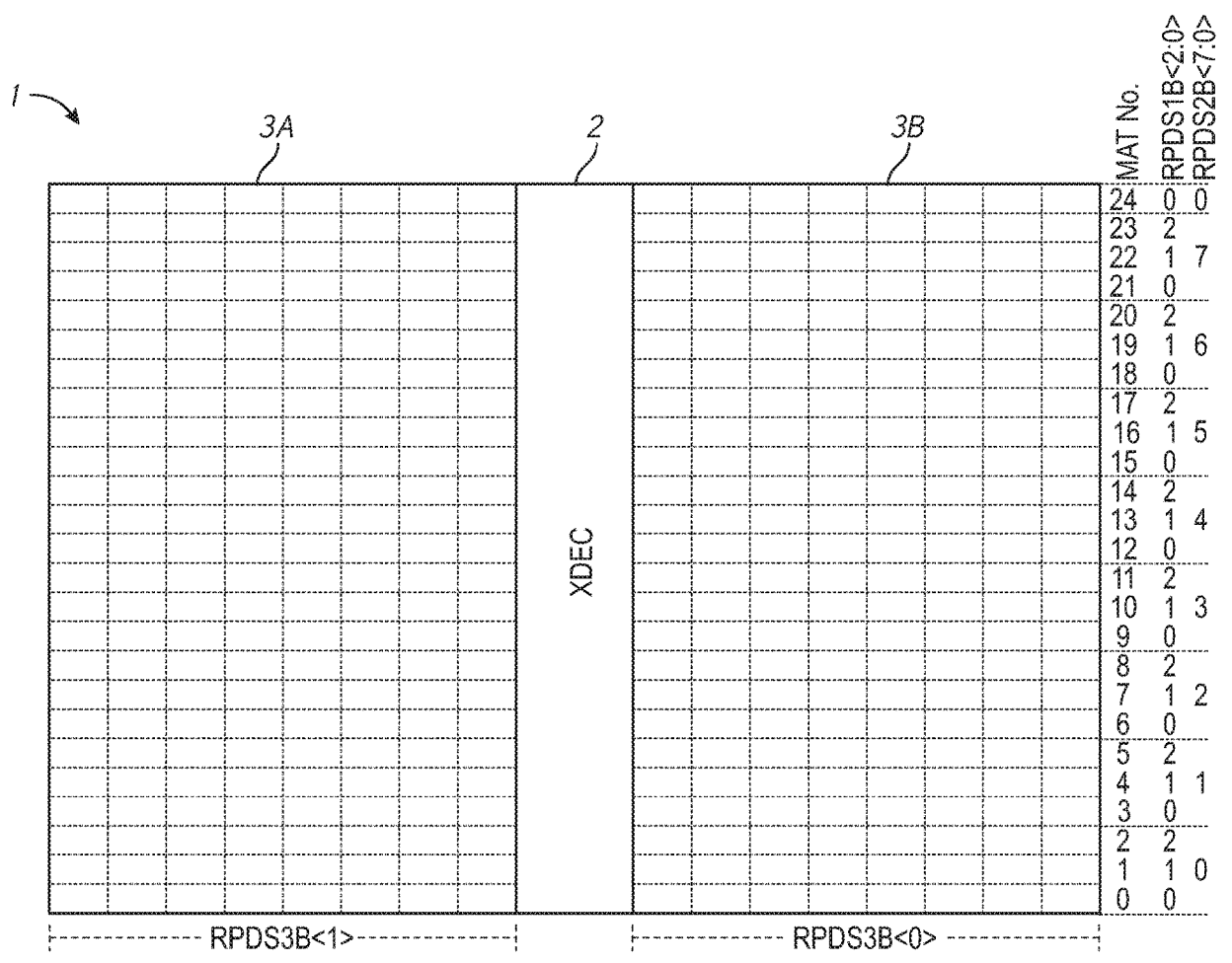

FIG. 3 is a layout diagram of a memory bank 1 in accordance with an embodiment of the present disclosure. Across an X decoder circuit 2, memory cell blocks 3A and 3B may be disposed on the right and left, respectively. With a predecode signal RPDS3B, either the memory cell block 3A (RPDS3B<1>) or the memory cell block 3B (RPDS3B<0>) may be selected. For example, each memory cell block (e.g., a memory cell array) may be divided into twenty-five segments in one direction (e.g., vertically in FIG. 3). Each memory mat MAT may be selected with a combination of predecode signals RPDS1B<2:0> and RPDS2B<7:0>. For example, one of the predecode signals RPDS1B<2:0> and one of the predecode signals RPDS2B<7:0> may be in an active state for selection of one memory mat MAT.

Figure 1:
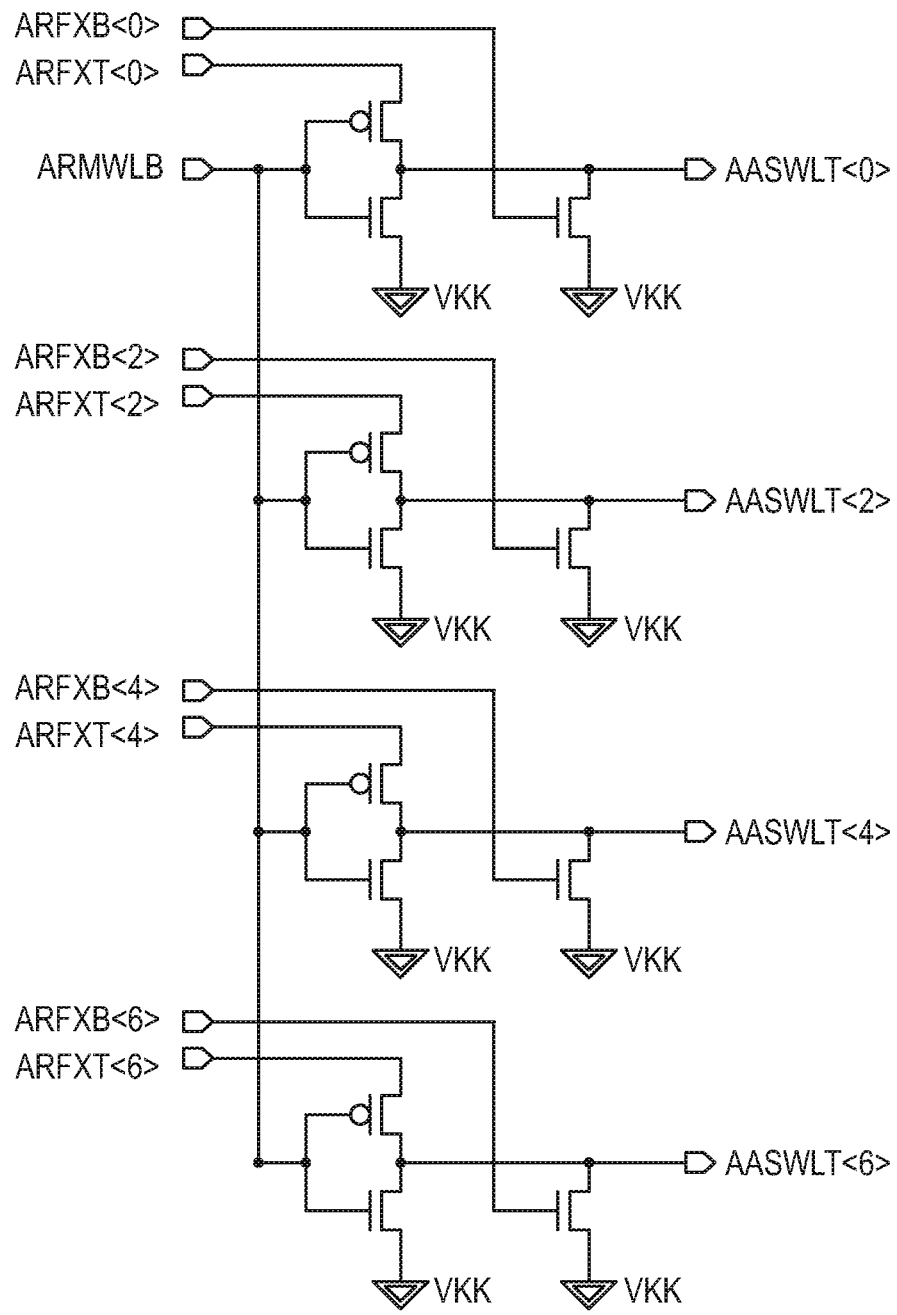
FIG. 1 is a circuit diagram of a sub-word driver circuit in a memory device.
Figure 2:
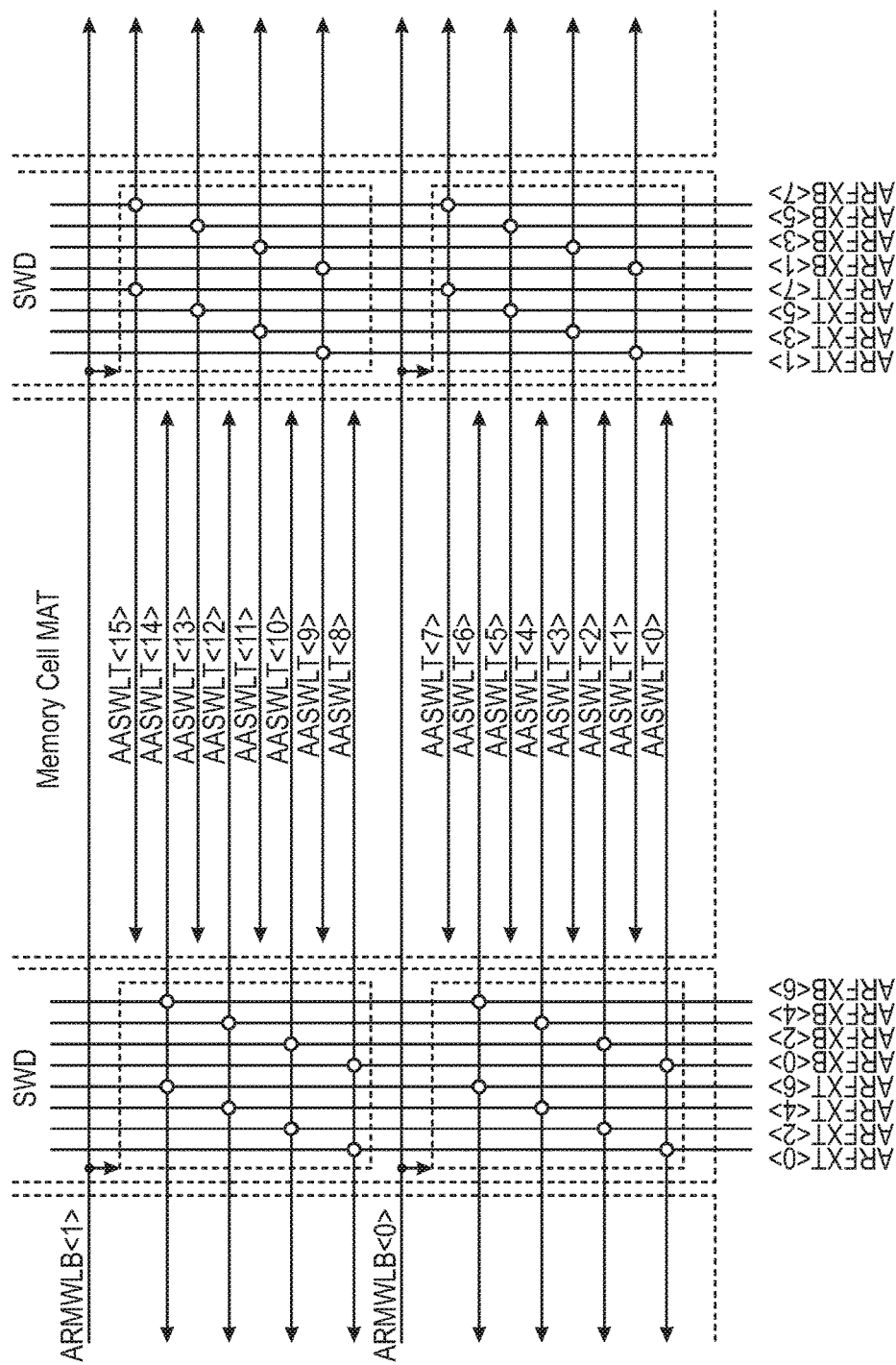
FIG. 2 is a schematic diagram of main word lines (ARM-WLB), word driver selecting lines (ARFXT/ARFXB), and sub-word lines (AASWLT) in a memory mat (MAT) in the memory device.
Figures 4, 5:
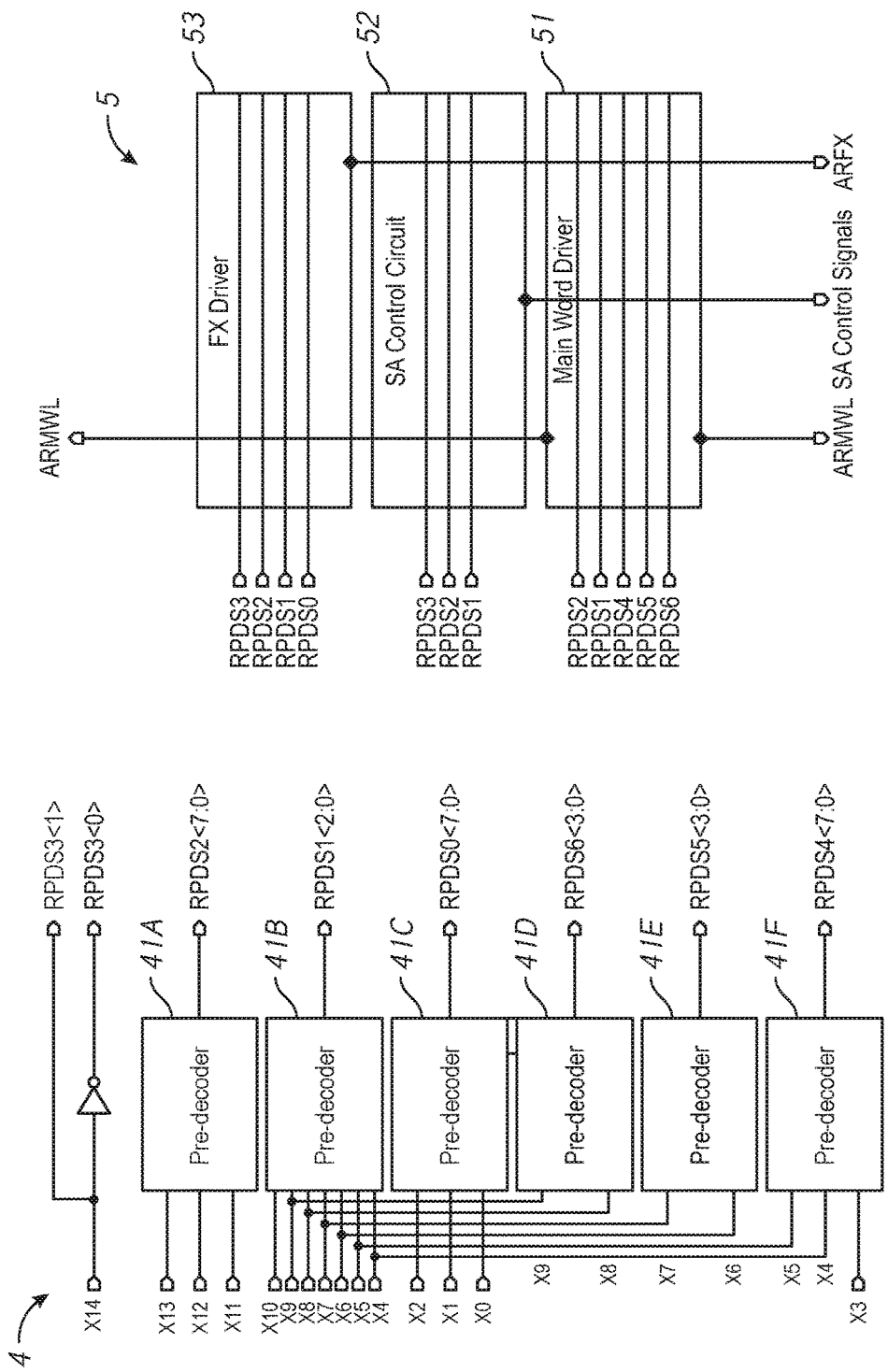
FIG. 4 is a block diagram of a predecoder circuit in accordance with an embodiment of the present disclosure.
FIG. 5 is a schematic diagram of an X decoder circuit in accordance with an embodiment of the present disclosure.

FIG. 4 is a block diagram of a predecoder circuit 4 in accordance with an embodiment of the present disclosure. For example, the predecoder circuit 4 may include a plurality of pre-decoders 41A to 41F that receives X address signals X0 to X13. The pre-decoder 41A may receive a plurality (e.g. three) of most significant bits excluding the most significant bit (e.g., X11-X13) of X address signals and may provide predecode signals RPDS2<7:0>. The pre-decoder 41B may receive X4-X0 of X address signals and may provide predecode signals RPDS1<2:0>. The pre-decoder 41C may receive a plurality of least significant bits (e.g., X0-X2) of X address signals and may provide predecode signals RPDS0<7:0>. The pre-decoder 41D may receive X9 and X8 of X address signals and may provide predecode signals RPDS6<3:0>. The pre-decoder 41E may receive X7 and X6 of X address signals and may provide predecode signals RPDS5<3:0>. The pre-decoder 41F may receive X3-X5 of X address signals and may provide predecode signals RPDS4<7:0>. A most significant bit (e.g., X14) of X address signal may be provided as a predecode signal RPDS3<1> and an inverse signal of X14 may be provided as a predecode signal RPDS3<0>.

FIG. 5 is a schematic diagram of an X decoder circuit 5 in accordance with an embodiment of the present disclosure. The X decoder circuit 5 may receive the predecode signals RPDS0 to RPDS6 and select a corresponding main word line ARMWL and corresponding word driver selecting lines ARFX responsive to the predecode signals RPDS0 to RPDS6. For example, the X decoder circuit 5 may include a main word driver 51, an SA control circuit 52 and an FX driver 53. For example, the main word driver 51 may include select one memory mat MAT, and the FX driver 53 may select two memory mats MAT. The SA control circuit 52 may control a sense amplifier unit SA adjacent to the selected memory mats MAT responsive to the X address signals. For example, the SA control circuit 52 may activate a sense amplifier SA (shown later in FIG. 10) between the selected memory mats MAT upon a selection of the sense amplifier SA.

Figure 6:
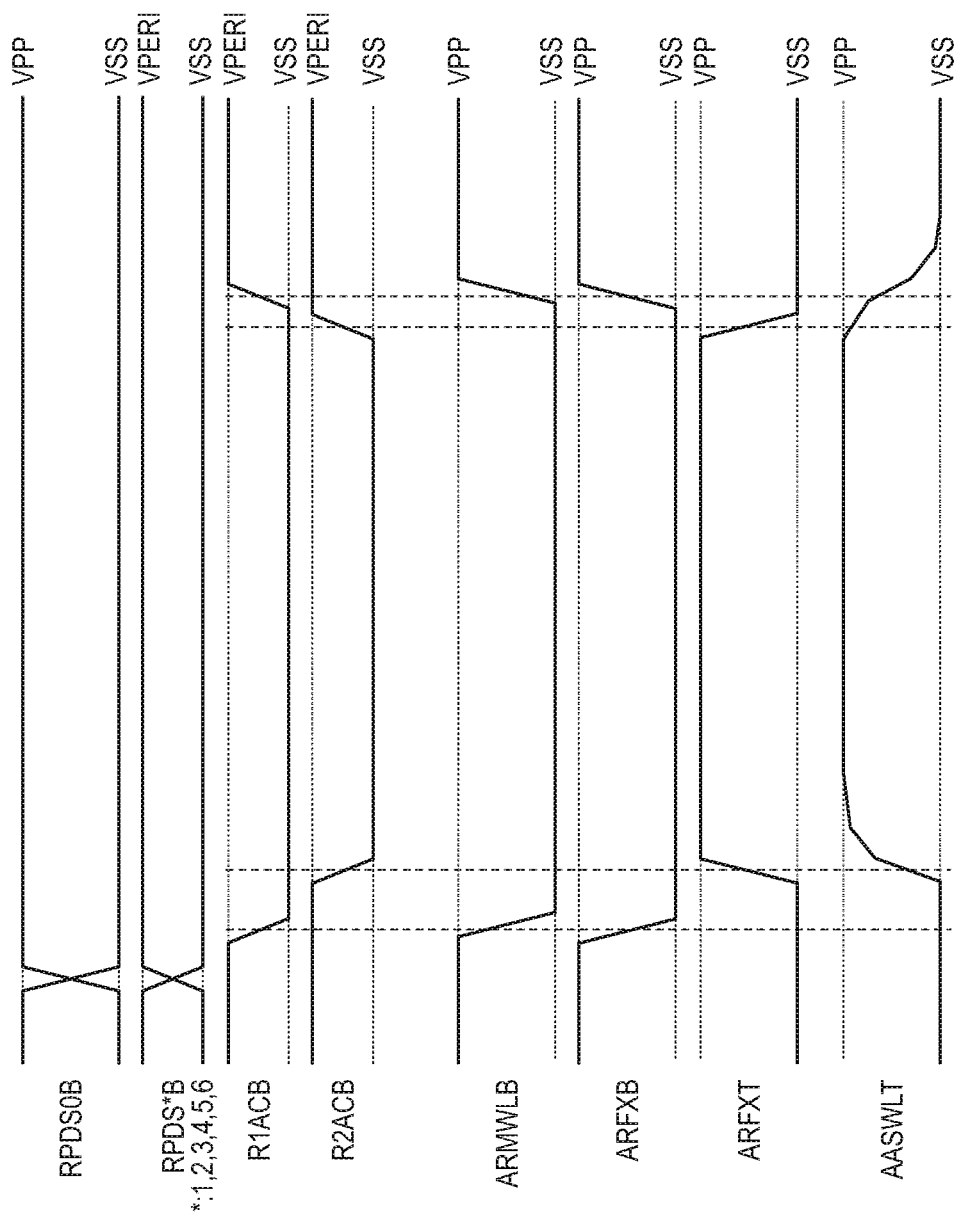
FIG. 6 is a timing diagram of signals for sub-word line activation in the memory bank in accordance with an embodiment of the present disclosure.

FIG. 6 is a timing diagram of signals for sub-word line activation in the memory bank 1 in accordance with an embodiment of the present disclosure. Logic levels of pre-decode signals RPDS0 to RPDS6, a mat selection signal, and timing control signals (e.g., R1ACB and R2ACB) may change upon a reception of an ACT command and/or a PRE command. For example, logic levels of a pair of the word driver selecting lines ARFXT and ARFTB may change responsive to the timing control signals R2ACB and R1ACB, respectively. One sub-word line may be selected responsive to the main word line ARMWL signal and the pair of the word driver selecting lines ARFXT and ARFTB.

Figure 7:
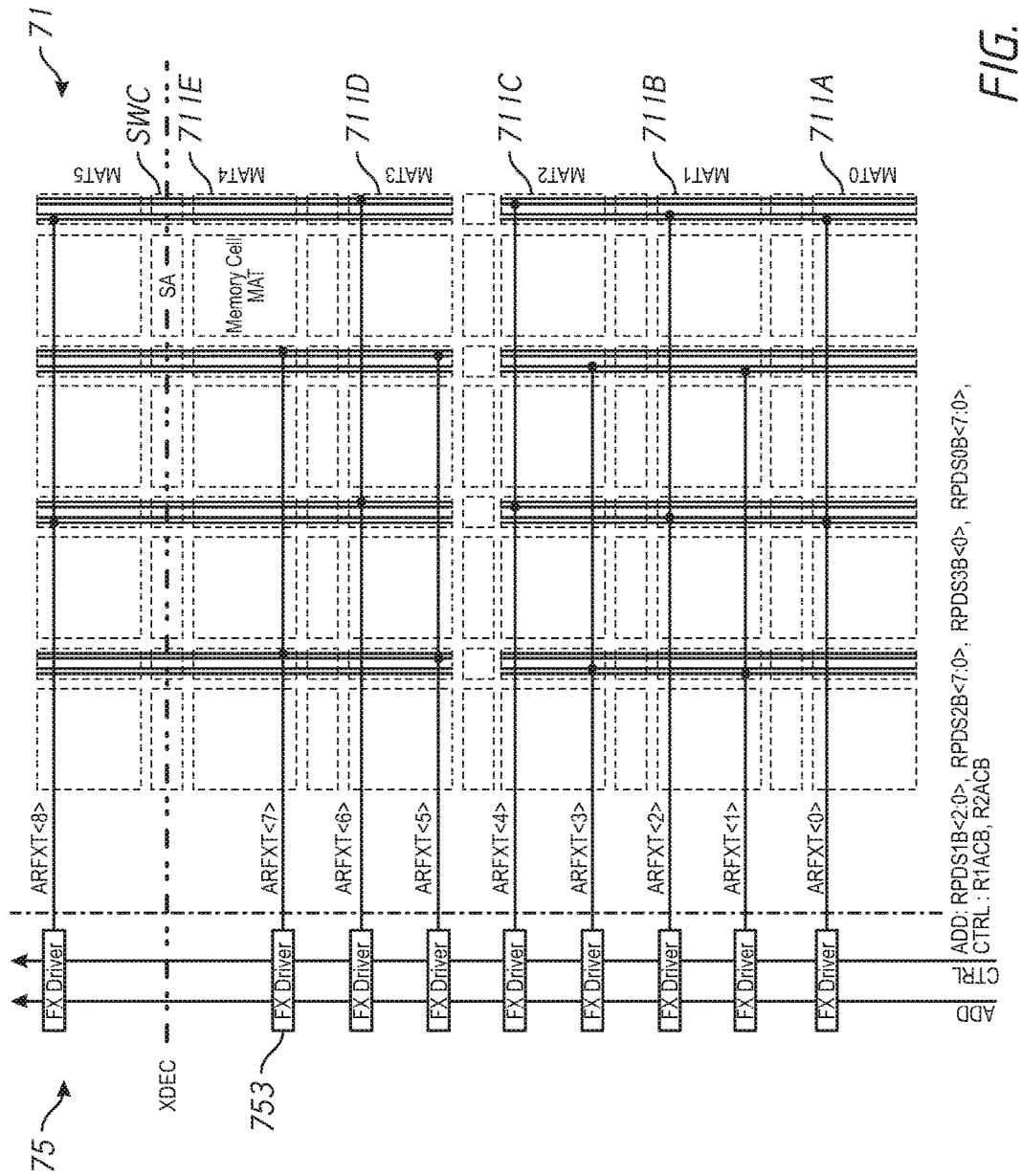
FIG. 7 is a schematic diagram of word driver selecting lines in memory mats MAT0 to MAT5 in the memory bank in accordance with an embodiment of the present disclosure.

FIG. 7 is a schematic diagram of word driver selecting lines in memory mats MAT0 to MAT5 in the memory bank 71 in accordance with an embodiment of the present disclosure. As described above, the word driver selecting lines ARFXT and ARFTB are a pair of complementary signals and each of the word driver selecting lines in FIG. 7 includes a pair of wirings ARFXT (e.g., ARFXT0 to ARFXT8) and ARFXB (e.g., ARFXB0 to ARFXB8, not shown). For example, the memory bank 71 may include a plurality of adjacent memory mats (e.g., MAT0 to MAT4) in one direction, sense amplifier units SA between adjacent two memory mats in the one direction, sub-word drivers SWD 711A to 711E of the plurality of adjacent memory mats (e.g., MAT0 to MAT4) next to each memory mat of the plurality of adjacent memory mats (e.g., MAT0 to MAT4) in an other direction perpendicular to the one direction, and sub-word cross regions SWC adjacent to the sense amplifier unit SA in the one direction and between the sub-word drivers SWD in the other direction. Each ARFXT signal (e.g., ARFXT0, ARFXT2, ARFXT4 or ARFXT6) in the sub-word drivers SWD 711A to 711E of a plurality of adjacent memory mats (e.g., MAT0 to MAT4) may simultaneously drive the plurality of adjacent memory mats. For example, each memory cell block (e.g., a memory cell array) may include twenty-five segments in a direction the plurality of memory mats MAT0 to MAT4 are aligned as shown in FIG. 3, the twenty-five segments (memory mats MAT) may be divided into a number of groups of five adjacent memory mats. As a result, ARFXT signals, including ARFXT0-8, etc. in the sub-word drivers SWD, including 711A to 711E etc., in the memory cell block may be divided into five groups.

Figure 8:
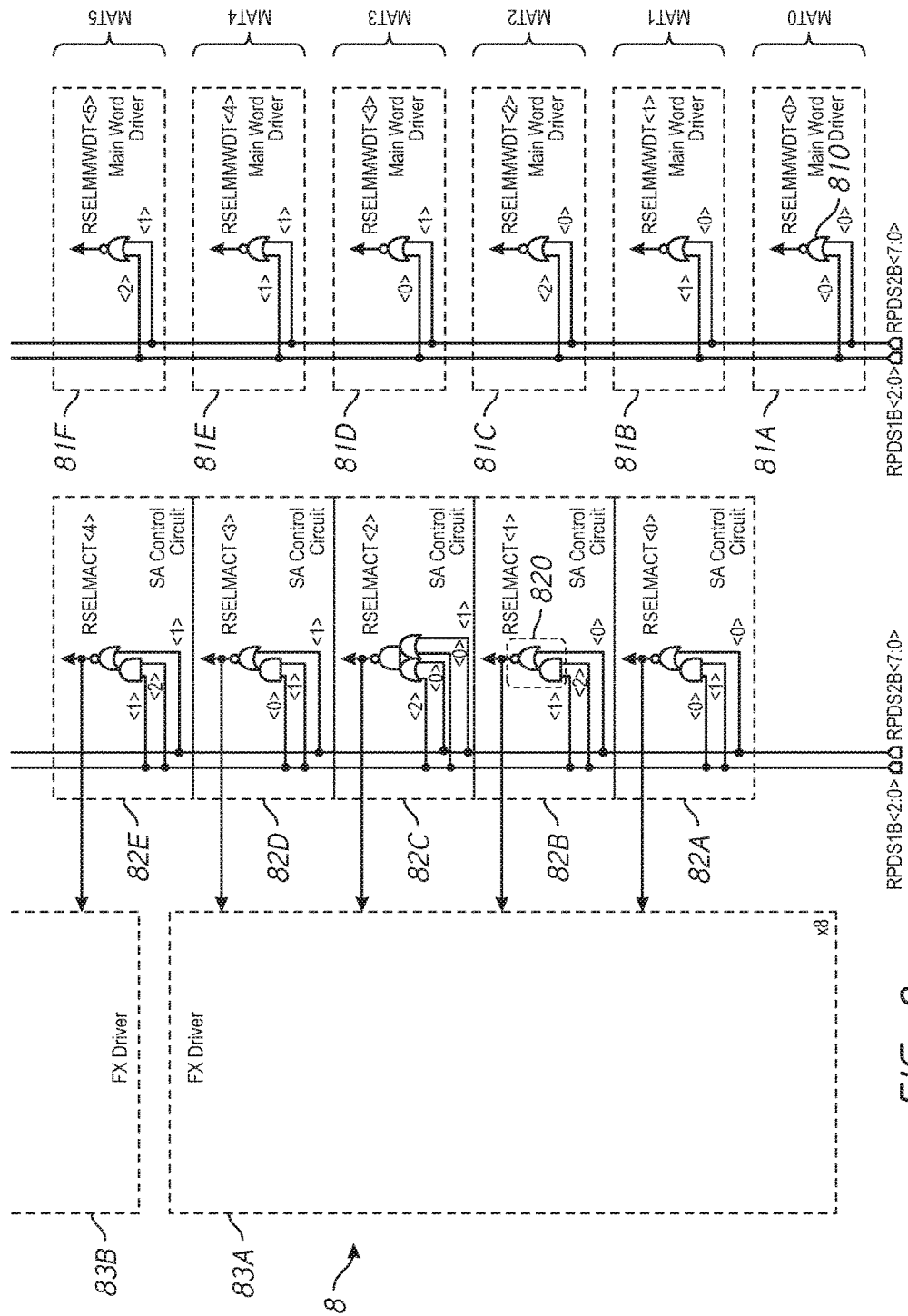
FIG. 8 is a schematic diagram of a mat selection logic circuit in an X decoder circuit in accordance with an embodiment of the present disclosure.

FIG. 8 is a schematic diagram of a mat selection logic circuit 8 in an X decoder circuit in accordance with an embodiment of the present disclosure. For example, the X decoder circuit may be the X decoder circuit 75 in FIG. 7. The mat selection logic circuit 8 may include a plurality of main word drivers MWD including main word drivers 81A to 81F, a plurality of SA control circuits including SA control circuits 82A to 82E and a plurality of FX drivers (e.g., eight FX drivers), including FX drivers 83A and 83B. For example, each main word driver MWD of the plurality of MWDs 81A to 81F may include a MWD logic circuit 810 (e.g., NOR logic). The MWD logic circuits 810 of MAT0 to MAT5 may receive one of predecode signals RPDS1B<2:0> and one of predecode signals RPDS2B<7:0> and provide RSELMMWDT<0> to RSELMMWDT<5> signals, respectively.

Each SA control circuit of the plurality of SA control circuits 82A to 82E may include a SA control logic circuit 820 (e.g., an NOR logic and an AND logic having an output node coupled to one input node of the NOR logic). The SA control logic circuit 820 in each SA control circuit may receive one or more predecode signals of predecode signals of RPDS1B<2:0> and one or more predecode signals of predecode signals RPDS2B<7:0> and may provide an SA mat selection signal RSELMACT, such as RSELMACT<0> to RSELMACT<4> to the FX driver, such as the FX drivers 83A and 83B. Although not shown in FIG. 8, each SA control circuit (e.g., 82A to 82E) may combine each RSELMACT signal with a timing control signal RSAN signal to provide a SAN signal for activating a transistor (e.g., n-channel type MOS transistor) in a data read operation from memory cell in the SA control circuit. Each SA control circuit (e.g., 82A to 82E) may also combine the RSELMACT with a sense amplifier timing control signal RSAP to provide a SAP signal which may activate a transistor (e.g., p-channel type MOS transistor) in the data read operation.

FIG. 9A is a circuit diagram of an FX driver circuit 93 in accordance with an embodiment of the present disclosure. The FX driver circuit 93 may receive the control signals R2ACB and R1ACB, the predecode signals RPDS0B and RPDS3B, and the FX mat selection signal RSELMFXT. In a conventional circuit, a predecode signal is inputted by a compound logical element to generate a mat selection signal inside the circuit. In the present invention, a mat selection signal generated inside MWD or inside the SA control circuit in the X decoder circuit, other than the FX driver circuit unit is diverted for use. With this, the logical element units for mat selection in the X decoder circuit can be simplified (commonality of logical elements can be achieved). Also, while a cell derived from a logical element unit is provided in the conventional technology for consideration of an end mat, commonality of all circuits can be achieved in the present invention.

FIG. 9B is a circuit diagram of a pre-FX driver circuit 930 in accordance with an embodiment of the present disclosure. For example, each FX driver of the plurality of FX drivers (e.g., 83A, 83B) in FIG. 8 may include the pre-FX driver circuit 930 that may be an NOR logic. For example the pre-FX driver circuit 930 in the FX driver 83A may receive SA mat selection signals RSELMACT<0> to RSELMACT<3> signals from the adjacent SA control circuits 82A to 82D and may provide an FX mat selection signal RSELMFXT<0> signal.

FIG. 9C is a block diagram of a mat selection logic circuit 8' in an X decoder circuit in accordance with an embodiment of the present disclosure. For example, the mat selection logic circuit 8' may include a row control circuit 95, a pre-decoder circuit 94, an SA control circuit 92, a pre-FX driver circuit 940 and an FX driver circuit 93. For example, the row control circuit 95 may receive row control signals, such as a row address strobe (RAS) signal, a command address strobe (CAS) signal and a write enable (WE) signal, that may change responsive to upon a reception of an ACT command and/or a PRE command. Responsive to the row control signals, the row control circuit 95 may provide timing control signals (e.g., R1ACB and R2ACB). A pre-decoder circuit 94 may receive address signals and provide predecode signals (e.g., RPDS0<7:0>, RPDS3, RPDS2, RPDS1). For example, the pre-decoder circuit 94 may be the pre-decoder circuit 4 in FIG. 4. The SA control circuit 92 may be the SA control circuit, such as SA control circuits 82A to 82D in FIG. 8, that may receive the predecode signals RPDS1 and RPDS2 and may provide the plurality of SA mat selection signals RSELMACT. The pre-FX driver 940 may be the pre-FX driver 930 in FIG. 9B that may provide the FX mat selection signal responsive to the plurality of SA mat selection signals. In FIG. 9C, the pre-FX driver 940 is disposed between the SA control circuit 92 and the FX driver circuit 93. As variations, the pre-FX driver 940 may be located in the SA control circuit 92, or may be included in the FA driver circuit 93. The FX driver circuit 93 may be the FX driver circuit 93 in FIG. 9A. The FX driver circuit may receive the control signals R1ACB, R2ACB, the predecode signals RPDS0<7:0>, RPDS3, and the FX mat selection signal RSELMFXT and may provide word driver selecting signals on the word driver selecting lines ARFXT<0:7>.

Figure 10A:
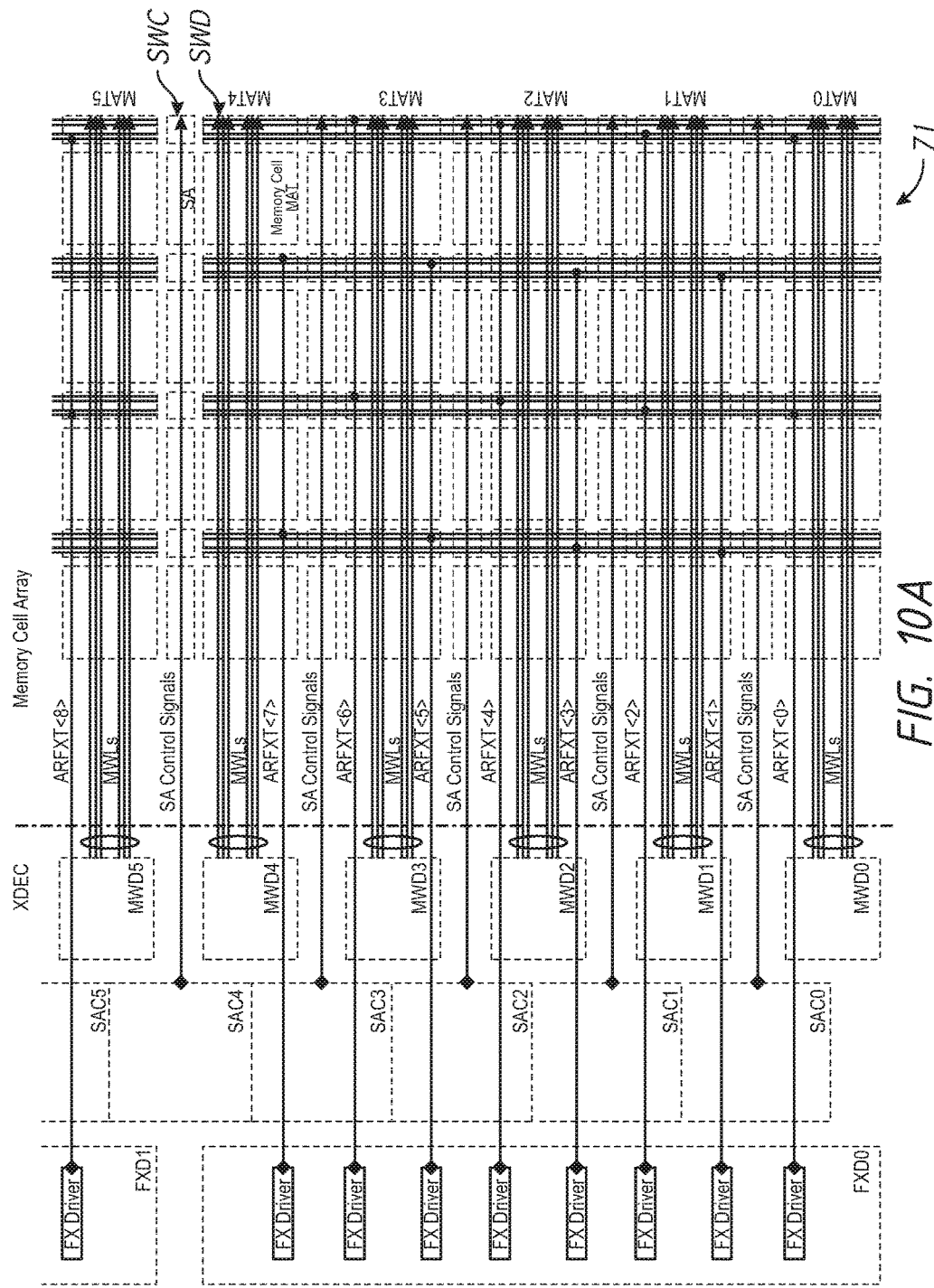
FIGS. 10A and 10B are schematic diagrams of word driver selecting lines in memory mats MAT0 to MAT5 in the memory bank in accordance with an embodiment of the present disclosure.
Figure 10B:
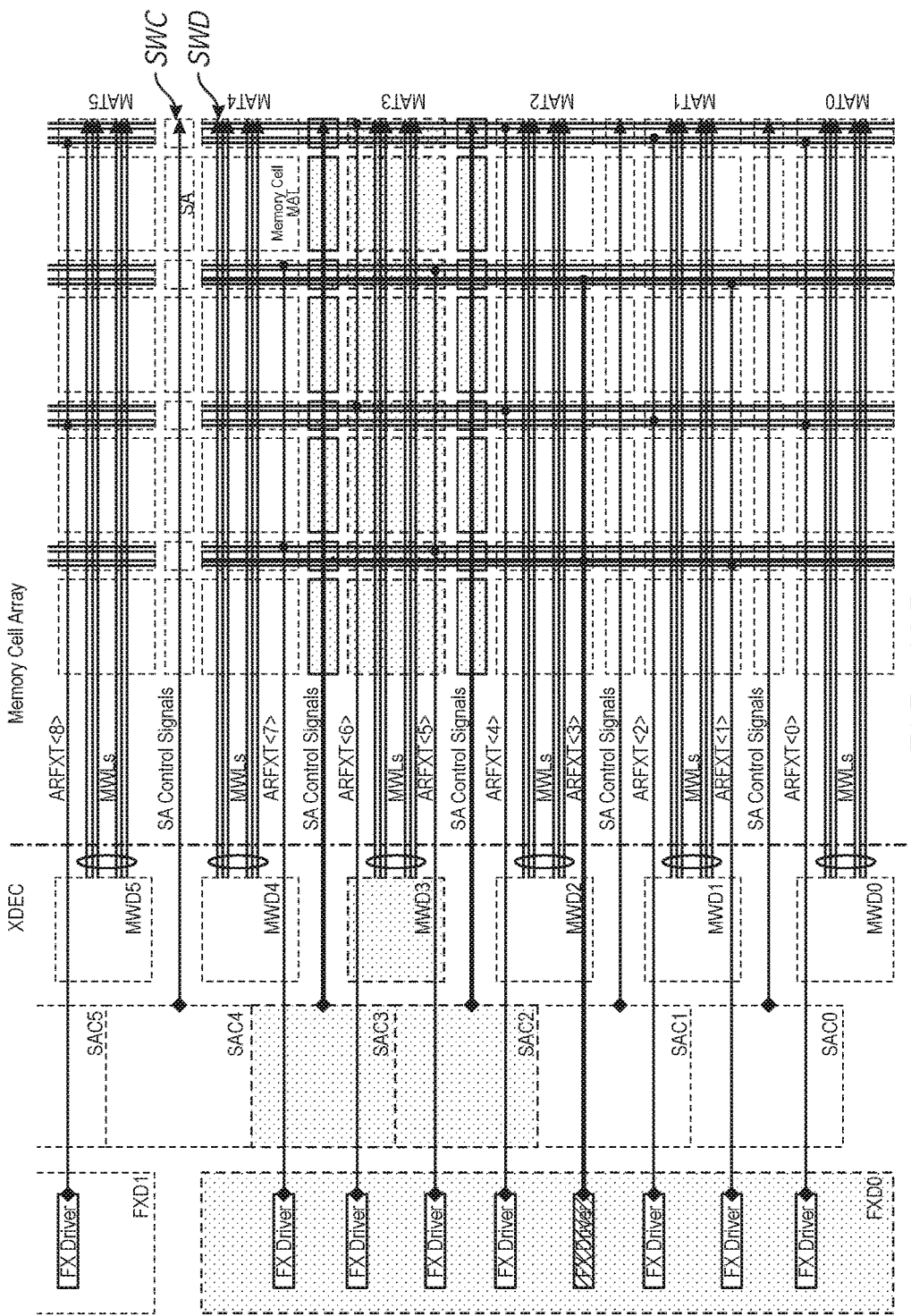

FIGS. 10A and 10B are schematic diagrams of word driver selecting lines in memory mats MAT0 to MAT5 in the memory bank 101 in accordance with an embodiment of the present disclosure. The memory bank 101 may further include sense amplifier (SA) control circuits SAC0 to SAC5 providing SA control signals (e.g., SA mat selection signal RSELMACT) to the sense amplifier units SA. For example, the schematic diagram of FIG. 10B shows when memory cells in the memory mat MAT3 is accessed. A main word driver MWD3 and a FX driver may activate a main word line MWL and a word driver selecting line ARFXT<3> respectively responsive to address signals indicative of a memory cell, in order to access the memory cell in the memory mat MAT3. The SA control circuits SAC2 and SAC3 may activate the SA control signals in order to read out data from the memory cell in the memory mat MAT3. For example, the word driver selecting line ARFXT<3> may be used for accessing memory cells in five memory mats MAT0 to MAT4. In the memory bank 101, four SA control circuits SAC0 to SAC3 may be used for accessing memory cells in the memory mat MAT0 to MAT4. Thus, each FX driver may use four SA mat selection signals, RSELMACT<0-3> to access memory cells in the memory mats MAT0 to MAT4.

Figure 11:
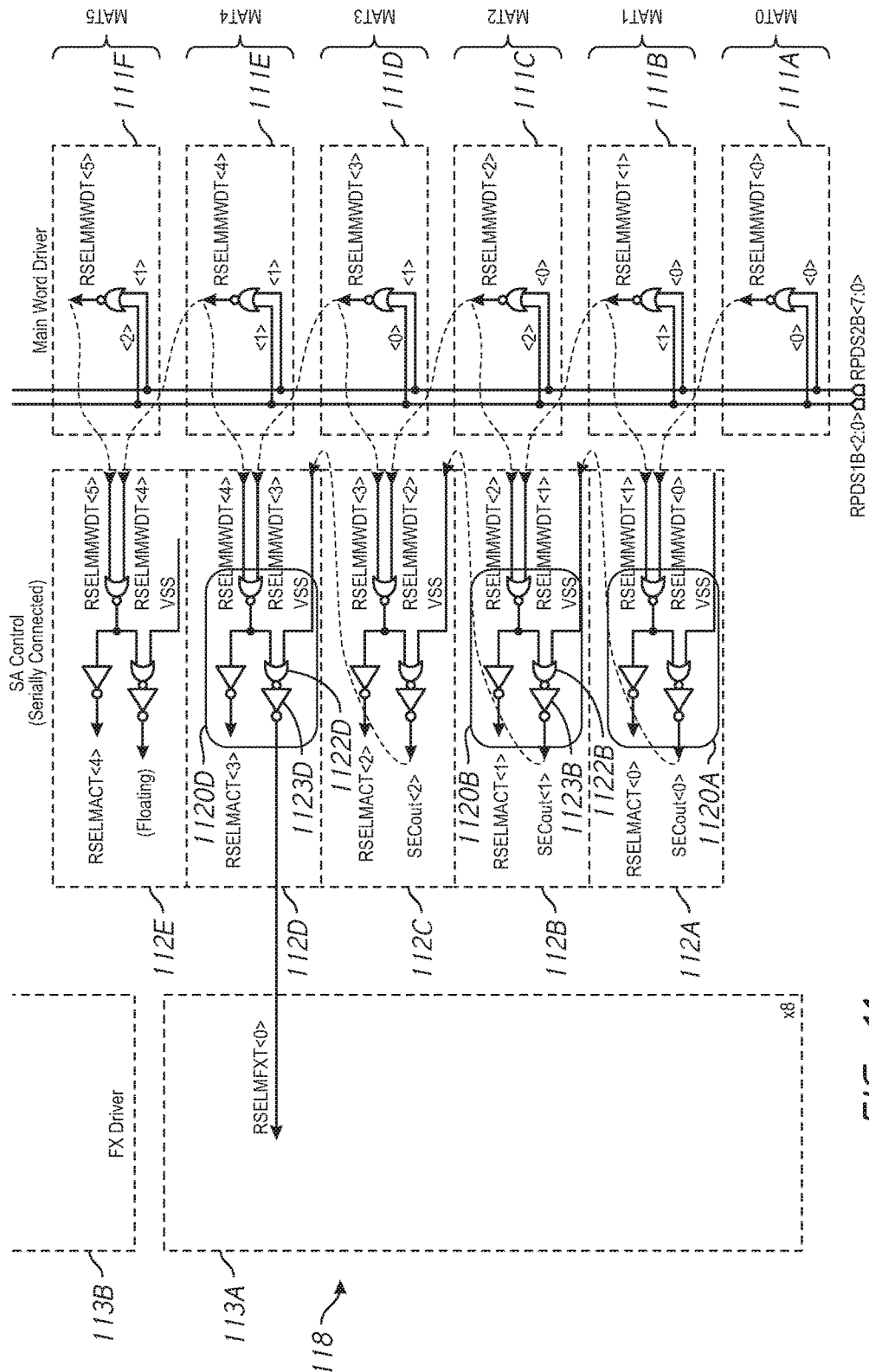
FIG. 11 is a schematic diagram of a mat selection logic circuit in an X decoder circuit in accordance with an embodiment of the present disclosure.

FIG. 11 is a schematic diagram of a mat selection logic circuit 11 in an X decoder circuit in accordance with an embodiment of the present disclosure. For example, the X decoder circuit may be the X decoder circuit 75 in FIG. 7. The mat selection logic circuit 11 may include a plurality of main word drivers MWD including main word drivers 111A to 111F, a plurality of SA control circuits including SA control circuits 112A to 112E and a plurality of FX drivers (e.g., eight FX drivers), including FX drivers 113A and 113B. For example, similarly to 81A to 81F in FIG. 8, each main word driver MWD of the plurality of MWDs 111A to 111F may include a MWD logic circuit (e.g., NOR logic).

Each SA control circuit of the plurality of SA control circuits 112A to 112E may include a SA control logic circuit 1120. The SA control logic circuit 1120 may receive a plurality of RSELMMWDT signals from adjacent MWDs instead of the predecode signals. The SA control logic circuit 1120 may further receive an output signal SECout of an adjacent SA control logic circuit 1120 and may provide an output signal SECout and an SA mat selection signals, RSELMACT. For example, the SA control logic circuit 1120B in the SA control circuit 11213 may include an NOR logic 1121B that receives RSELMMWDT<1, 2> signals from two adjacent MWDs 111B and 111C. The SA control logic circuit 1120B may further include a combination of an NOR logic 1122B and an inverter 1123B that may receive an output signal of the NOR logic 1121B and an output signal SECout<0> of the adjacent SA control logic circuit SA 1120A at input nodes of the NOR logic 1122B and may provide an output signal SECout<1> from an output node of the inverter 1123B. The SA control logic circuit 1120B may further provide an inverted signal of the output signal of the NOR logic 1121B as an SA mat selection signal, RSELMACT<1>. Thus, the SA control circuits 112A to 112D may be serially coupled. The SA control logic circuit 1120D may provide an FX mat selection signal RSELMFXT<0> signal from an output node of an inverter 1123D to the FX driver 113A. In this example, the pre-FX driver circuit 930 may not be included in the FX drivers 113A, 113B, etc., and a set of the serially coupled SA control circuits 112A to 112D may perform as a circuit including the pre-FX driver circuit 940.

Figure 12:
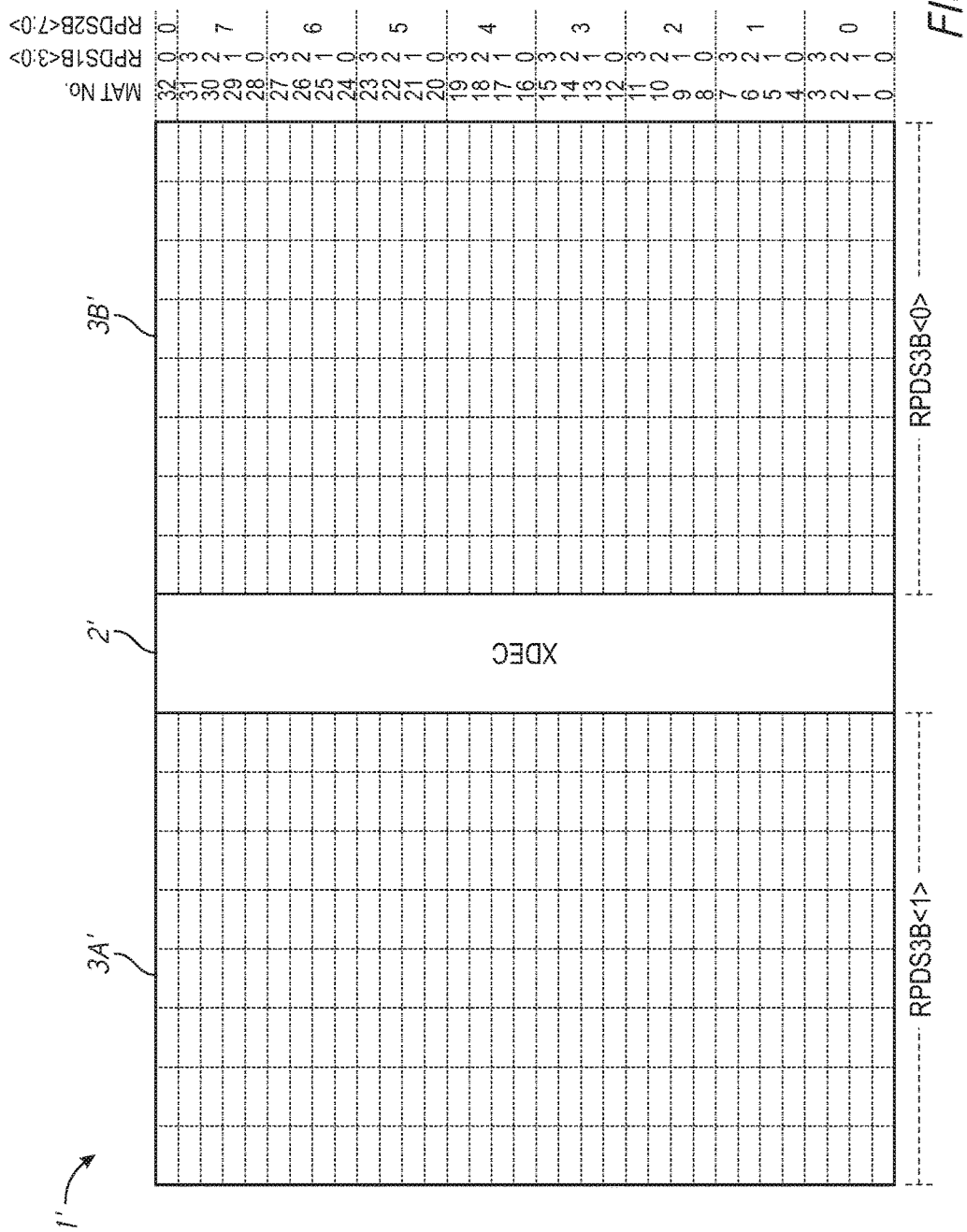
FIG. 12 is a layout diagram of a memory bank in accordance with an embodiment of the present disclosure.

FIG. 12 is a layout diagram of a memory bank 1' in accordance with an embodiment of the present disclosure. Across an X decoder circuit 2', memory cell blocks 3A' and 3B' may be disposed on the right and left, respectively. With a predecode signal RPDS3B, either the memory cell block 3A' (RPDS3B<1>) or the memory cell block 3B' (RPDS3B<0>) may be selected. For example, each memory cell block (e.g., a memory cell array) may be divided into thirty-three segments in one direction (e.g., vertically in FIG. 12). Each memory mat MAT may be selected with a combination of predecode signals RPDS1B<3:0>, and RPDS2B<7:0>. For example, one of the predecode signals RPDS1B<3:0> and one of the predecode signals RPDS2B<7:0> may be in an active state for selection of one memory mat MAT.

Figure 13:
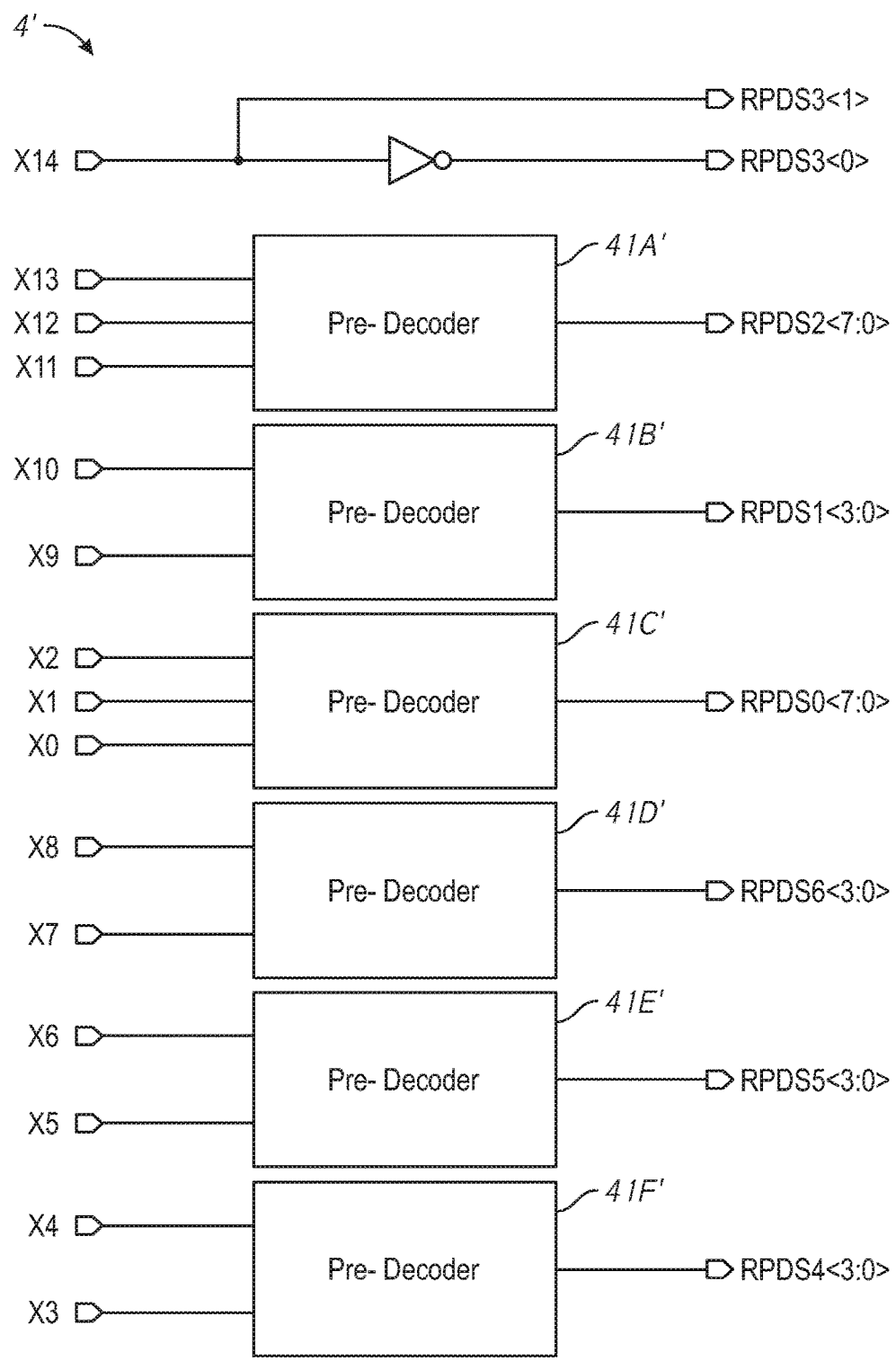
FIG. 13 is a block diagram of a predecoder circuit in accordance with an embodiment of the present disclosure.

FIG. 13 is a block diagram of a predecoder circuit 4' in accordance with an embodiment of the present disclosure. For example, the predecoder circuit 4' may include a plurality of pre-decoders 41A' to 41F' that receives X address signals X0 to X14. The pre-decoder 41A' may receive X11-X13 of X address signals and may provide predecode signals RPDS2<7:0>. The pre-decoder 41B' may receive X9 and X10 of X address signals and may provide predecode signals RPDS1<3:0>. The pre-decoder 41C' may receive X0-X2 of X address signals and may provide predecode signals RPDS0<7:0>. The pre-decoder 41D' may receive X8 and X7 of X address signals and may provide predecode signals RPDS6<3:0>. The pre-decoder 41E' may receive X6 and X5 of X address signals and may provide predecode signals RPDS5<3:0>. The pre-decoder 41F' may receive X4 and X3 of X address signals and may provide predecode signals RPDS4<3:0>. X14 of X address signal may be provided as a predecode signal RPDS3<1> and an inverse signal of X14 may be provided as a predecode signal RPDS3<0>. The predecode signals may be provided to the X decoder circuit (e.g., the X decoder circuit 5 in FIG. 5).

Figure 14:
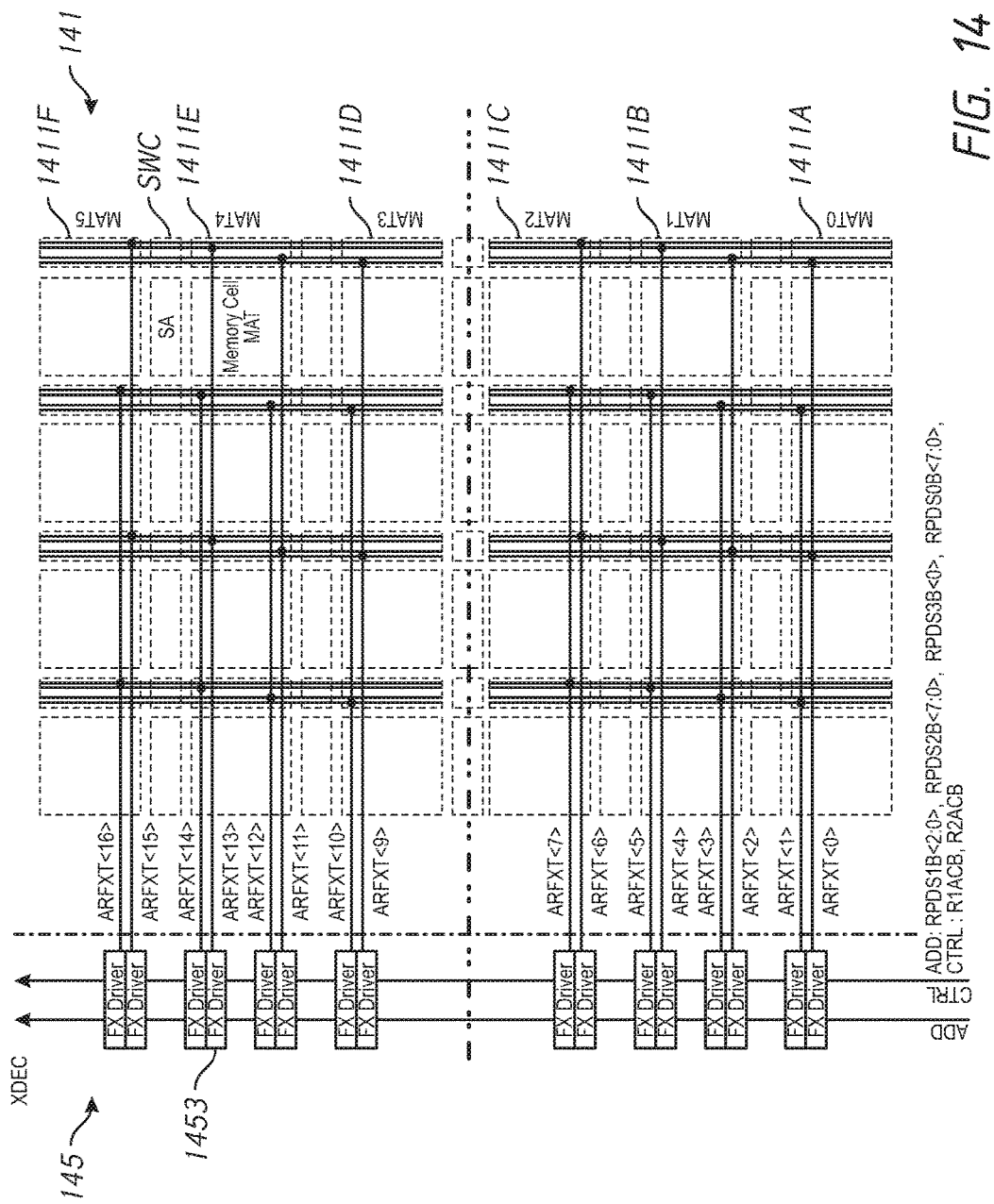
FIG. 14 is a schematic diagram of word driver selecting lines in memory mats MAT0 to MAT5 in the memory bank in accordance with an embodiment of the present disclosure.

FIG. 14 is a schematic diagram of word driver selecting lines in memory mats MAT0 to MAT5 in the memory bank 141 in accordance with an embodiment of the present disclosure. As described above, the word driver selecting lines ARFXT and ARFTB are a pair of complementary signals and each of the word driver selecting lines in FIG. 14 includes a pair of wirings ARFXT (e.g., ARFXT0 to ARFXT16) and ARFXB (e.g., ARFXB0 to ARFXB16, not shown). For example, the memory bank 141 may include a plurality of adjacent memory mats (e.g., MAT0 to MAT5) in one direction, sense amplifier units SA between adjacent two memory mats in the one direction, sub-word drivers SWD 1411A to 1411F of the plurality of adjacent memory mats (e.g., MAT0 to MAT5) next to each memory mat of the plurality of adjacent memory mats (e.g., MAT0 to MAT5) in an other direction perpendicular to the one direction, and sub-word cross regions SWC adjacent to the sense amplifier unit SA in the one direction and between the sub-word drivers SWD in the other direction. Each pair of ARFXT signal (e.g., ARFXT0-1, ARFXT2-3 and ARFXT4-5 or ARFXT6-7) in the sub-word drivers SWD 1411A to 1411C of a plurality of adjacent memory mats (e.g., MAT0 to MAT2) may simultaneously drive the plurality of adjacent memory mats. For example, each memory cell block (e.g., a memory cell array) may include thirty-three segments (e.g., memory mats MAT) in a direction the plurality of memory mats MAT0 to MAT5 are aligned as shown in FIG. 14, the thirty-three segments may be divided into a number of groups of three adjacent memory mats. As a result, ARFXT signals, including ARFXT0-16 in the sub-word drivers SWD including 1411A to 1411F in the memory cell block may be divided into eleven groups.

Figure 15:
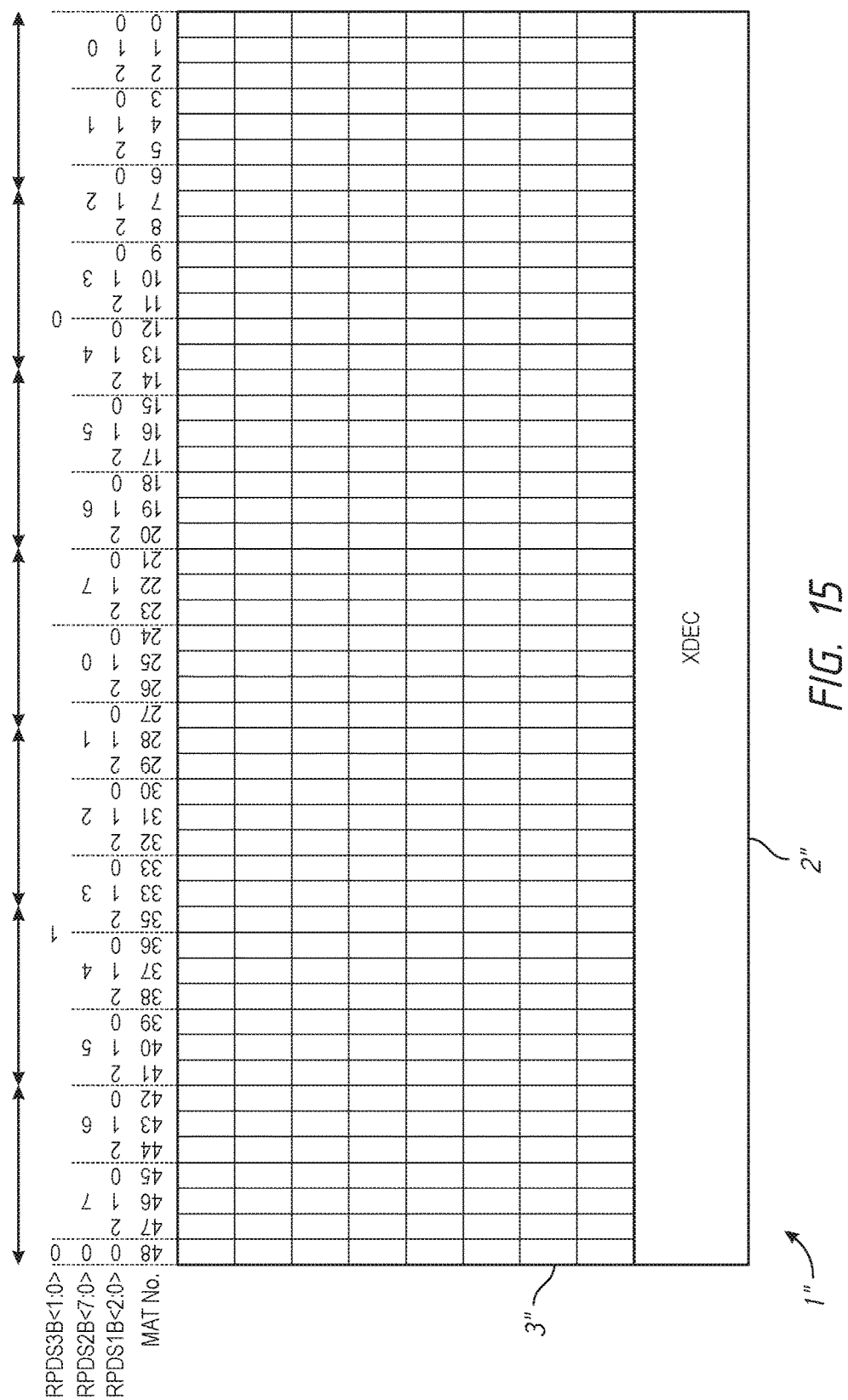
FIG. 15 is a layout diagram of a memory bank in accordance with an embodiment of the present disclosure.

FIG. 15 is a layout diagram of a memory bank 1" in accordance with an embodiment of the present disclosure. A memory cell block 3" may be disposed adjacent to an X decoder XDEC 2". For example, each memory cell block (e.g., a memory cell array) may be divided into forty-nine segments in one direction (e.g., horizontally in FIG. 15). Each memory mat MAT may be selected with a combination of predecode signals RPDS1B<2:0>, RPDS2B<7:0> and RPDS3B<1:0>. For example, one of the predecode signals RPDS1B<3:0>, one of the predecode signals RPDS2B<7:0> and one of the predecode signals RPDS3B<7:0> may be in an active state for selection of one memory mat MAT. For example, with the predecode signal RPDS3B<0> or <1>, one memory mat MAT of memory mats MAT <0-23, 48> or one memory mat MAT of memory mats MAT <24-27> may be selected. Since each memory cell block (e.g., a memory cell array) may include forty-nine segments (e.g., memory mats MAT) in a direction the plurality of memory mats MAT0 to MAT48 are aligned as shown in FIG. 15, the forty-nine segments may be divided into a number of groups of seven adjacent memory mats. As a result, ARFXT signals in the sub-word drivers SWD in the memory cell block may be divided into seven groups.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a plurality of memory mats;
   a plurality of sense amplifiers, each sense amplifier of the plurality of sense amplifiers being coupled to a corresponding memory mat of the plurality of memory mats and configured to be activated for a data access operation to a memory cell in the corresponding memory mat;
   a plurality of word drivers, each word driver of the plurality of word drivers being coupled to a corresponding memory mat of the plurality of memory mats;
   a sense amplifier control circuit coupled to the plurality of sense amplifiers and configured to provide a plurality of control signals, each control signal of the plurality of control signals being provided to a corresponding sense amplifier of the plurality of sense amplifiers to activate the corresponding sense amplifier coupled to the corresponding memory mat; and
   a driver coupled to the sense amplifier control circuit, configured to receive the plurality of control signals from the sense amplifier control circuit, and further configured to provide a selection signal to the plurality of word drivers responsive to the plurality of control signals.

2. The apparatus of claim 1, wherein the driver comprises a first logic circuit configured to receive the plurality of control signals and further configured to provide the selection signal.

3. The apparatus of claim 1, wherein the sense amplifier control circuit comprises a first logic gate configured to receive a first plurality of main word line selection signals and further configured to provide a first portion of the plurality of control signals.

4. The apparatus of claim 3, further comprising a second logic circuit configured to receive the plurality of control signals and further configured to provide a driver control signal to the driver.

5. The apparatus of claim 3, wherein the sense amplifier control circuit is a first sense amplifier control circuit, wherein the apparatus further comprises a second sense amplifier control circuit comprising a second logic circuit configured to receive a second plurality of main word line selection signals and further configured to provide a second plurality of control signals,
   wherein the first logic circuit is configured to provide an intermediate control signal, and
   wherein the second logic circuit is further configured to receive the intermediate control signal and further configured to provide a driver control signal to the driver.

6. The apparatus of claim 3, further comprising a predecoder circuit configured to receive a plurality of address signals and further configured to provide a plurality of predecode signals, wherein the driver is configured to provide the selection signal to the plurality of word driver responsive, at least in part, to a portion of the plurality of predecode signals.

7. The apparatus of claim 6, wherein the portion of the plurality of predecoded signals are responsive to a plurality of least significant bits of the plurality of address signals.

8. An apparatus comprising:
a plurality of sense amplifier control circuits coupled to a plurality of sense amplifiers, wherein the plurality of sense amplifier control circuits is configured to provide a plurality of control signals to a plurality of corresponding sense amplifiers, respectively, wherein each of the plurality of control signal is configured to activate a corresponding sense amplifier of the plurality of corresponding sense amplifiers; and
a driver configured to receive a first control signal, and further configured provide a selection signal to a plurality of word drivers responsive, at least in part, to the first control signal that is responsive to the plurality of control signals from the plurality of sense amplifier control circuits.

9. The apparatus of claim 8, further comprising a pre-driver circuit configured to receive the plurality of control signals from the plurality of sense amplifier control circuits and further configured to provide the first control signal to the driver.

10. The apparatus of claim 8, wherein the driver is further configured to receive at least one timing control signal and further configured to provide the selection signal responsive, at least in part, to the first control signal and further responsive to the at least one timing control signal.

11. The apparatus of claim 8, further comprising a predecoder circuit configured to receive a plurality of address signals and further configured to provide a plurality of predecode signals,
wherein the driver is configured to provide the selection signal to the plurality of word driver responsive, at least in part, to a first portion of the plurality of predecode signals.

12. The apparatus of claim 11, wherein the first portion of the plurality of predecode signals are responsive to a plurality of least significant bits of the plurality of address signals.

13. The apparatus of claim 11, wherein the plurality of sense amplifier control circuits are configured to receive a second portion of the plurality of predecode signals, and
wherein each sense amplifier control circuit of the plurality of sense amplifier control circuits is configured to provide the plurality of control signals responsive to the second portion of the plurality of predecode signals.

14. The apparatus of claim 13, wherein the second portion of the plurality of predecode signals are responsive to a plurality of most significant bits excluding the most significant bit of the plurality of address signals.

15. The apparatus of claim 8, wherein the plurality of sense amplifier control circuits comprises:

a first sense amplifier control circuit configured to provide a second control signal of the plurality of control signals; and
a second sense amplifier control circuit configured to receive the second control signal and further configured to provide the first control signal to the driver.

16. The apparatus of claim 15, further comprising a plurality of main word drivers, wherein each main word driver of the plurality of main word drivers is configured to provide a respective main word line selection signal responsive, at least in part, to address signals, and
wherein each sense amplifier control circuit of the plurality of sense amplifier control circuits is configured to receive main word line selection signals from adjacent main word drivers of the plurality of main word drivers and further configured to provide the plurality of control signals responsive to the corresponding pair of adjacent main word line selection signals.

17. The apparatus of claim 16, wherein the first sense amplifier control circuit and the second sense amplifier control circuit are configured to receive at least one main word line selection signal in common.

18. A method comprising:
providing a plurality of sense amplifier mat selection signals to a plurality of sense amplifiers coupled to a plurality of memory mats;
providing a first control signal responsive to the plurality of sense amplifier mat selection signals; and
providing a plurality of sub word driver selection signals to a plurality of corresponding word drivers responsive, at least in part, to the first control signal.

19. The method of claim 18, further comprising:
receiving a plurality of address signals;
providing a plurality of predecode signals responsive to the plurality of address signals; and
receiving a portion of the plurality of predecode signals, wherein the plurality of sense amplifier mat selection signals are provided responsive to the plurality of predecode signals.

20. The method of claim 18, further comprising:
receiving a first set of main word line selection signals from a first set of main word drivers by a first sense amplifier control circuit;
providing a second control signal by the first sense amplifier control circuit responsive, at least in part, to the first set of main word line selection signals;
receiving a second set of main word line selection signals from a second set of main word drivers by a second sense amplifier control circuit;
receiving the second control signal by the second sense amplifier control circuit; and
providing the first control signal by the second sense amplifier control circuit responsive, at least in part, to the second control signal and the second set of main word line selection signals.

* * * * *